United States Patent [19]
Fukushima et al.

[11] 4,347,584
[45] Aug. 31, 1982

[54] PROGRAMMABLE READ-ONLY MEMORY DEVICE

[75] Inventors: Toshitaka Fukushima, Yokohama; Kazumi Koyama, Ikoma; Kouji Ueno, Kawasaki; Yuichi Kawabata, Yokohama; Tamio Miyamura, Kawasaki, all of Japan

[73] Assignee: Fujitsu Limited, Kawasaki, Japan

[21] Appl. No.: 141,934

[22] Filed: Apr. 21, 1980

[30] Foreign Application Priority Data

Apr. 23, 1979 [JP] Japan .................................. 54-50036

[51] Int. Cl.³ .............................................. G11C 7/00
[52] U.S. Cl. ...................................... 365/104; 365/230
[58] Field of Search ............................. 365/230, 104

[56] References Cited
U.S. PATENT DOCUMENTS

| | | | |
|---|---|---|---|
| 3,509,548 | 4/1970 | Sinden | 365/230 |
| 3,863,230 | 1/1975 | Regitz et al. | 365/230 |
| 3,902,082 | 8/1975 | Proebsting et al. | 365/230 |
| 4,086,500 | 4/1978 | Suzuki et al. | 365/230 |

Primary Examiner—Vincent P. Canney
Attorney, Agent, or Firm—Staas & Halsey

[57] ABSTRACT

A PROM device having the improved bit address decoders composed of a plurality of AND gates, each of the AND gates comprising PNP type transistors, to each base of which is applied an address signal from the bit address inverters. Each collector of these transistors is connected to ground, and each emitter is connected to the output terminal of the bit address decoder.

9 Claims, 8 Drawing Figures

PROGRAMMABLE READ-ONLY MEMORY DEVICE

BACKGROUND OF THE INVENTION (1) Field of the Invention

The present invention relates to a programmable read-only memory device, and more particularly to a bipolar semiconductor programmable read-only memory device having improved bit address decoder circuits, used in electronic equipment such as an electronic computer.

(2) Description of the Prior Art

In general, a programmable read only memory (PROM) device comprises a plurality of memory cells disposed at each cross position of the matrix which is formed by a intersection of a plurality of bit lines and a plurality of word lines. Each of the memory cells is, for example, a shorted-junction type or a fuse-blown type cell, and is connected between one of the word lines and one of the bit lines. The PROM device also comprises address buffers or address inverters which amplify and invert input address signals, decoders which decode the address signals from the address buffers, multiplexers or encoders which encode information from the memory cells, output buffers which amplify output signals from the multiplexers, and program circuits or writing-in circuits which initially write in information to the selected memory cell.

In the prior art PROM device, several kinds of decoders are used including a word address decoder for decoding word address signals in order to select one of the word lines, and bit address decoders for decoding bit address signals in order to select one of the bit lines. The bit address decoder of one kind is connected to the multiplexer and is used for reading-out of information from the selected memory cell, and the bit address decoder of the other kind is connected to the program circuit and is used for writing-in of information to the selected memory cell. These two kinds of bit address decoders are supplied with the same bit address signals. Each of the bit address decoders is composed of a plurality of AND gates, each of which consists of a plurality of diodes. Therefore, the sink current, which flows from the program circuit or multiplexer through the diodes to the bit address inverters, is relatively large. Consequently, it is necessary to use output power transistors having a large driving capability in the output stage of the bit address inverters, and it is also necessary to use different inverters for driving the two kinds of decoders.

In order to gain a large driving capability in the prior art PROM device the size of the output power transistors of the bit address inverters must be large, so that the packing density of the PROM device is reduced and the switching speed of the bit address inverters becomes low. Moreover, the prior art PROM device needs different bit address inverters for driving the two decoders, which also leads to a low packing density of the PROM device.

SUMMARY OF THE INVENTION

It is an object of the present invention to gain a high switching speed of the bit address inverters by decreasing the current which flows into the output stage of the bit address inverters when writing-in or reading-out of information is performed.

It is another object of the present invention to simplify the circuitry of the bit address inverters by using common bit address inverters for driving both the decoders, in the reading-out stage and in the writing-in stage.

These objects of the present invention are attained by providing the PROM device with bit address decoder circuits composed of a plurality of AND gates. Each of the AND gates includes a plurality of PNP type transistors, to each base electrode of which is applied the address signals from the bit address interters. Each collector electrode is connected commonly to the ground, and each emitter electrode is connected commonly as an output terminal of the bit address decoder circuit.

DETAILED DESCRIPTION OF THE INVENTION

[Prior Art]

Figure 1:
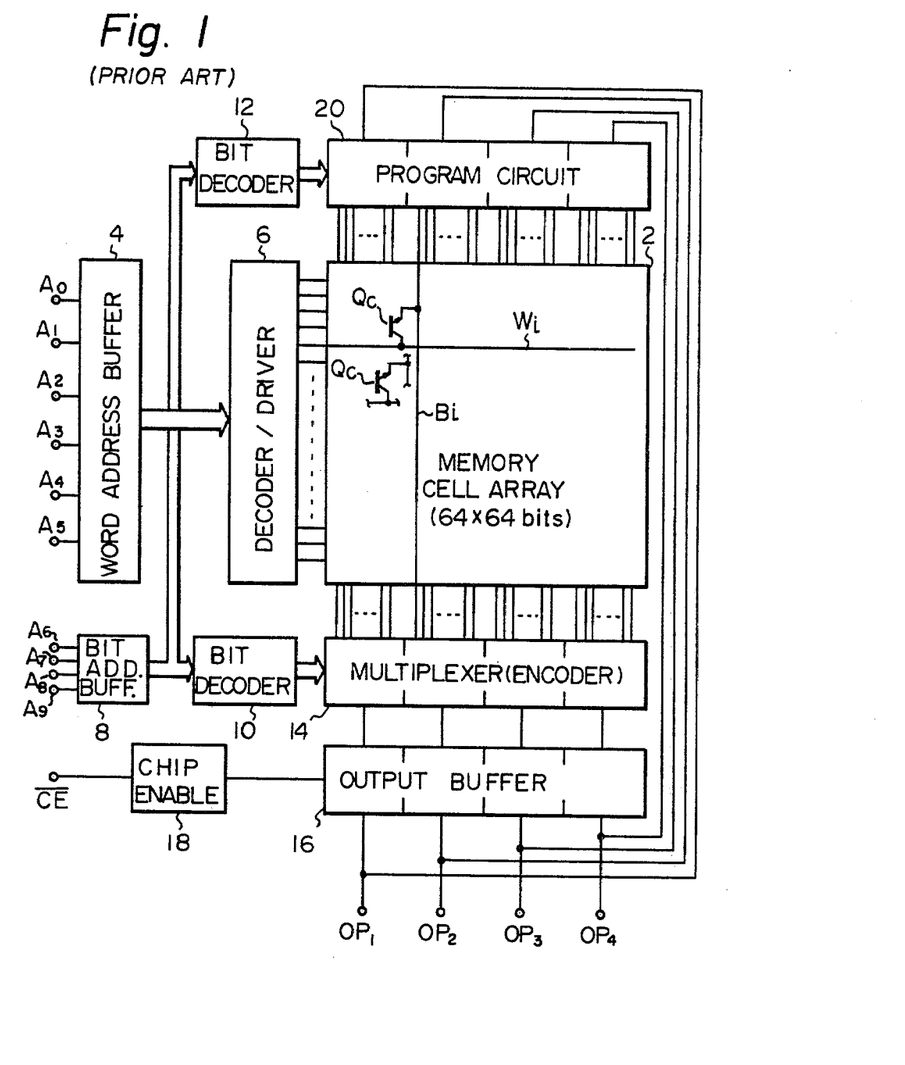
FIG. 1 is a block diagram of a conventional bipolar 4 K-bit PROM device.

FIG. 1 is a block diagram of a conventional bipolar 4 K-bit PROM device, which comprises a memory cell array 2 composed of 4096 memory cells disposed in a matrix of 64 rows and 64 columns. Each of the memory cells is composed, for example, of an open-base type transistor which is equivalent to a series connection of two diodes of opposite polarity. The writing-in of information to this memory cell is effected by short-circuiting one of the PN junctions by application of a large writing-in current. A word address buffer or word address inverters 4 amplify and invert input word address signals $A_0$ through $A_5$, and the word address decoder/driver 6 decodes the word address signals from the word address buffer 4 and applies the decoded word address signals to the memory cell array 2. The bit address buffer or bit address inverters 8 amplify and invert input bit address signals $A_6$ through $A_9$, and apply the output bit address signals to the bit address decoder 10 connected to the multiplexer 14, and to the bit address decoder 12 connected to the program circuit 20. The decoder 10 decodes the output bit address signals from the bit address buffer 8 and applies the decoded bit address signals (bit selection signals for reading-out) to the multiplexer 14. The multiplexer 14 reads out information from the memory cells connected between the word line selected by the above-mentioned word address decoder/driver 6 and the bit lines selected by the bit address decoder 10. The output buffer 16 amplifies the reading out signals from the multiplexer 14, and applies the amplified reading out signals to output terminals $OP_1$ through $OP_4$. The output buffer 16 is enabled by the chip enable circuit 18 which receives an input chip enable signal. The decoder 12 decodes the output bit address signals from the bit address buffer 8 and applies the decoded bit address signals (bit address signals for writing-in) to the program circuit 20. The program circuit 20 writes in information to the memory cells which are connected between the word line selected by the word address decoder/driver 6 and the bit lines selected by the bit address decoder 12.

The reading out of information from the above-mentioned PROM is effected by applying the 6 bit word address signals $A_0$ through $A_5$ to the word address buffer 4, the 4-bit bit address signals $A_6$ through $A_9$ to the bit address buffer 8, and a "low" level voltage to the chip enable circuit 18. 4 bits of information from the selected memory cells appears at the output terminals $OP_1$ through $OP_4$, through the multiplexer 14 and the output buffer 16.

The writing-in of information to the PROM is effected by applying the 6-bit word address signals $A_0$ through $A_5$ to the word address buffer 4, the 4-bit bit address signals $A_6$ through $A_9$ to the bit address buffer 8, and the "high" level voltage to the chip enable circuit 18. The 4-bit data signals to be written-in are applied to the output terminals $OP_1$ through $OP_4$ of the PROM device. In this case, the output buffer 16 is cut off from the output terminals $OP_1$ through $OP_4$ due to the "high" level signal to the chip enable circuit 18. Therefore, the data signals to be written-in pass from the output terminal to the program circuit 20, and the writing-in of information corresponding to the data signals to the selected memory cells is effected.

Figure 2:
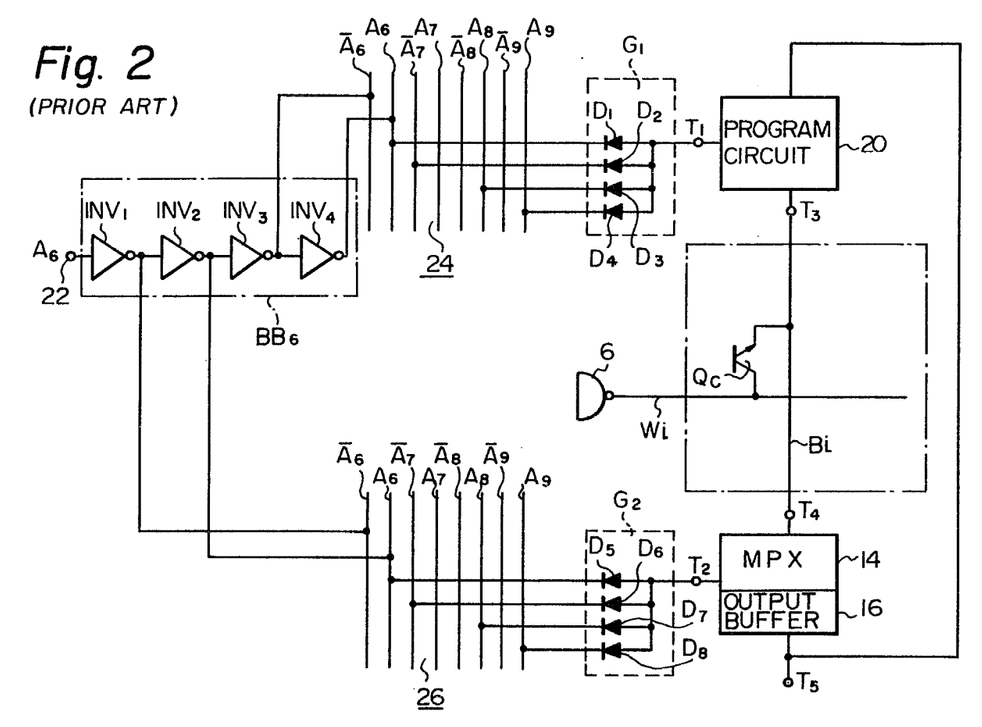
FIG. 2 is a partial block circuit diagram of a prior art PROM device having bit address decoders consisting of a plurality of diode AND gates.

FIG. 2 is a partial block diagram illustrating a conventional PROM device having bit address decoders consisting of a plurality of diode AND gates. In FIG. 2, the bit address buffer unit $BB_6$ consists of a series connection of four inverters $INV_1$ through $INV_4$. An input terminal 22 of the inverter $INV_1$ serves as the input terminal of the bit address buffer $BB_6$. Output terminals of the inverters $INV_1$ and $INV_2$ are connected to the corresponding leads of the address signal lines 26 in the reading-out stage, and output terminals of the inverters $INV_3$ and $INV_4$ are connected to the corresponding leads of the address signal lines 24 in the writing-in stage. In addition to the bit address buffer unit $BB_6$, there are three other bit address buffer units $BB_7$ through $BB_9$ connected to the bit address signal lines 24 and 26, which are not shown in the drawing. Bit address decoder units or AND gates $G_1$ and $G_2$ are connected respectively to the address signal lines 24 and 26. In addition to the AND gates $G_1$ and $G_2$, there are fifteen other AND gates connected to the address signal lines 24 and fifteen other AND gates connected to the address signal lines 26, which are not shown in the drawing. Output terminals $T_1$ and $T_2$ of the AND gates $G_1$ and $G_2$ are connected to the program circuit or the writing-in circuit 20 and to the multiplexer or the reading-out circuit 14 respectively. A terminal $T_3$ of the program circuit 20 is connected to one end of a bit line $B_i$, to which the emitter of the memory cell transistor $Q_c$ is connected. The collector of the memory cell transistor $Q_c$ is connected to a word line $W_i$ which is connected to an output terminal of the word address decoder/driver circuit 6. The other end of the bit line $B_i$ is connected to a bit line terminal $T_4$ of the multiplexer 14. An output terminal $T_5$ of the output buffer 16 is connected to a writing-in current input terminal of the program circuit 20.

Operation of the circuit illustrated in FIG. 2 will now be explained. The input bit address signal, for example, $A_6$ is applied to the address signal input terminal 22, and the address signals $A_6$ and $\overline{A}_6$ are produced by the inverters $INV_1$ through $INV_4$ and supplied to the address signal lines 24 and 26. The input bit address signals consist of four bit signals $A_6$ through $A_9$. Therefore, the other three bit address signals $A_7$, $A_8$, and $A_9$ are applied to the other inverter stages, which are not shown in the drawing, and the address signals $A_7$, $\overline{A}_7$, $A_8$, $\overline{A}_8$, $A_9$, and $\overline{A}_9$ are produced and supplied to the corresponding lines of the address signal lines 24 and 26.

The address signals from the address signal lines 24 and 26 are respectively supplied to the writing-in circuit 20 and the reading-out circuit 14 through the AND gates (decoder units) $G_1$ and $G_2$ and decoder output terminals $T_1$ and $T_2$.

The AND gates $G_1$ and $G_2$ each consist of four diodes $D_1$ through $D_4$ and $D_5$ through $D_8$ respectively. Each anode electrode of the diodes $D_1$ through $D_4$ is connected commonly to the decoder output terminal $T_1$, and each anode electrode of the diodes $D_5$ through $D_8$ is connected commonly to the decoder output terminal $T_2$. The cathode electrodes of the diodes $D_1$ through $D_4$ are connected, for example, to the leads $A_6$, $\overline{A}_7$, $A_8$, and $A_9$, respectively, of the address signal lines 24, and the cathode electrodes of the diodes $D_5$ through $D_8$ are connected to the corresponding leads $A_6$, $\overline{A}_7$, $A_8$, and $A_9$, respectively, of the address signal lines 26.

If one or more of the address signals $A_6$, $\overline{A}_7$, $A_8$, $A_9$, applied respectively to the diodes $D_1$, $D_2$, $D_3$, and $D_4$, which compose the AND gate $G_1$, is "low", the output signal from the AND gate $G_1$ goes "low" so that the writing-in circuit 20 is not enabled. If all of the address signals $A_6$, $\overline{A}_7$, $A_8$, and $A_9$ are "high", the output signal of the AND gate $G_1$ becomes high and current does not flow from the writing-in circuit 20 to the AND gate $G_1$ so that the writing-in circuit is enabled.

The writing-in circuit 20, which is enabled by the address signals $A_6$, $\overline{A}_7$, $A_8$, and $A_9$, passes the writing-in current supplied from the output terminal $T_5$ through the terminal $T_3$ to the bit line $B_i$ corresponding to the address signals.

The emitter-base junction of the memory cell transistor $Q_c$, which is connected between the above-mentioned bit line $B_i$ and the word line selected by the word address decoder/driver circuit 6, is short circuited due to the writing-in current; thereby the writing-in of information is performed.

With regard to the reading-out of information, when all of the address signals $A_6$, $\overline{A}_7$, $A_8$, and $A_9$ are "high", the output of the AND gate $G_2$ becomes "high", and the AND gate $G_2$ does not absorb current from the reading-out circuit 14, so that the reading-out circuit 14 is enabled and the reading-out of information from the corresponding bit line $B_i$ is performed.

If the memory cell transistor $Q_c$ connected between the bit line $B_i$ and the word line $W_i$ selected by the word address decoder/driver circuit 6 is short-circuited at its emitter-base junction, the reading-out current flows from the terminal $T_4$ through the bit line $B_i$, the cell transistor $Q_c$, and the word line $W_i$, to the word address decoder/driver circuit 6. If the memory cell transistor $Q_c$ is not short circuited, the reading-out current does not flow.

The reading-out circuit 14 detects the information from the memory cell $Q_c$ by detecting whether the above-mentioned reading-out current flows or not, and outputs the detected information from the output terminal $T_5$.

In this case, the selected word line $W_i$ is pulled down to "low" by the word address decoder/driver circuit 6; thereby the writing-in current or reading-out current can be absorbed by the circuit 6.

However, since each of the AND gates $G_1$ and $G_2$ of the circuit illustrated in FIG. 1 consists of diodes, the current which passes from the writing-in circuit 20 or the reading-out circuit 14 to the output stages of the bit address inverters $INV_1$ through $INV_4$ becomes relatively large, so that it is necessary to use transistors having a large current driving capability for the output transistors of the inverters $INV_1$ through $INV_4$.

In order to gain a large current driving capability, large transistors must be used in the output stage of the bit address inverters, so that the packing density of the PROM device is decreased and the operating speed of the inverters becomes low due to the increase of parasitic capacitance.

In the above-mentioned PROM device, the current flowing from the writing-in circuit 20 to the output stage of the inverters is several times as large as the current flowing from the reading-out circuit 14 to the output stage of the inverters. Therefore, the address signals supplied to the writing-in stage and the address signals supplied to the reading-out stage are produced by the different inverters.

[Preferred Embodiments of the Present Invention]

Figure 3:
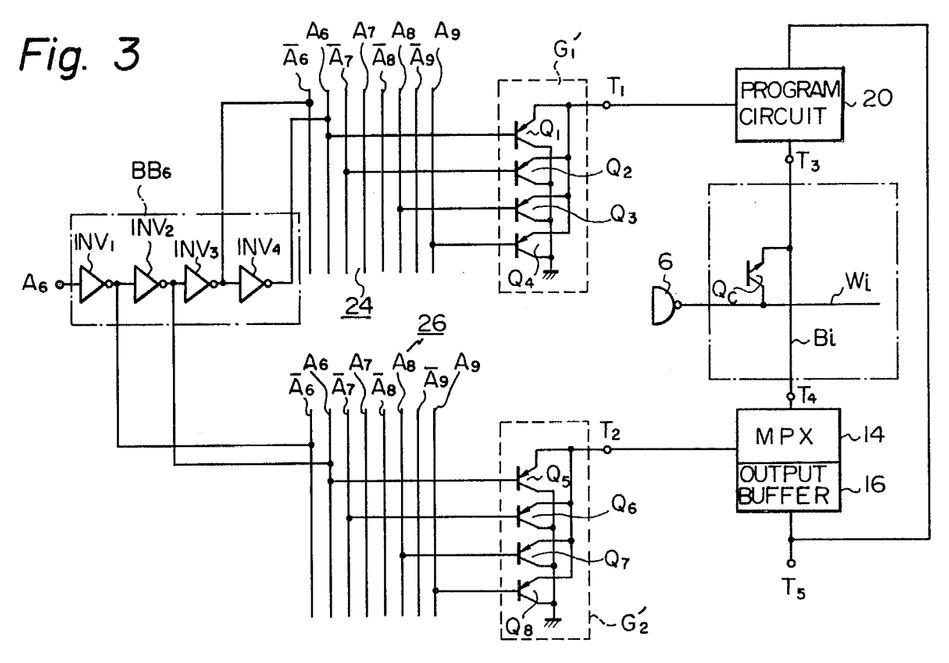
FIG. 3 is a partial block circuit diagram illustrating a part of a PROM device in an embodiment of the present invention, in which bit address decoders comprise a plurality of AND gates composed of PNP transistors.

With reference to FIG. 3, an embodiment of the present invention will now be described. A circuit shown in FIG. 3 includes improved bit address decoder units $G'_1$ and $G'_2$ which replace the decoder units $G_1$ and $G_2$ shown in FIG. 2. Each decoder unit $G'_1$ or $G'_2$ consists of four PNP type transistors, $Q_1$ through $Q_4$ or $Q_5$ through $Q_8$, instead of the diodes, $D_1$ through $D_4$ of the decoder $G_1$ or $D_5$ through $D_8$, of the decoder $G_2$ included in the circuit of FIG. 2. Each base electrode of the transistors $Q_1$ through $Q_4$ or $Q_5$ through $Q_8$ is connected to the address signal lines 24 or 26, each collector electrode is commonly connected to the ground, and each emitter electrode is commonly connected to the decoder output terminal $T_1$ or $T_2$. The other part of the circuit of FIG. 3 is the same as that of the circuit illustrated in FIG. 2, and the description thereof is omitted herein.

Operation of the improved decoder unit will now be described. When at least one of the address signals $A_6$, $\bar{A}_7$, $A_8$, or $A_9$ from the address signal lines 24 or 26 is "low", at least one of the transistors $Q_1$ through $Q_4$ or $Q_5$ through $Q_8$ turns on, and current I flows from the decoder output terminal $T_1$ or $T_2$ to the emitter electrode of one or more of the turned on transistors. Assuming that only one PNP transistor $Q_1$ is turned on, the above-mentioned current I passes from the emitter electrode of the transistor $Q_1$ to the base electrode and the collector electrode. In this case, almost all of the current I passes through the collector electrode to the ground, and the base current $I(1-\alpha)$ which is determined by the current amplification factor $\alpha$ is very small. For example, if $\alpha = 0.98$, then the base current is equal to I/50. Therefore, the current passing from the address signal lines 24 and 26 to the output stage of the bit address inverters $INV_1$ through $INV_4$ is greatly decreased, so that the size of each output transistor of the inverters can be decreased and a high operating speed of the inverters can be attained.

Figure 4:
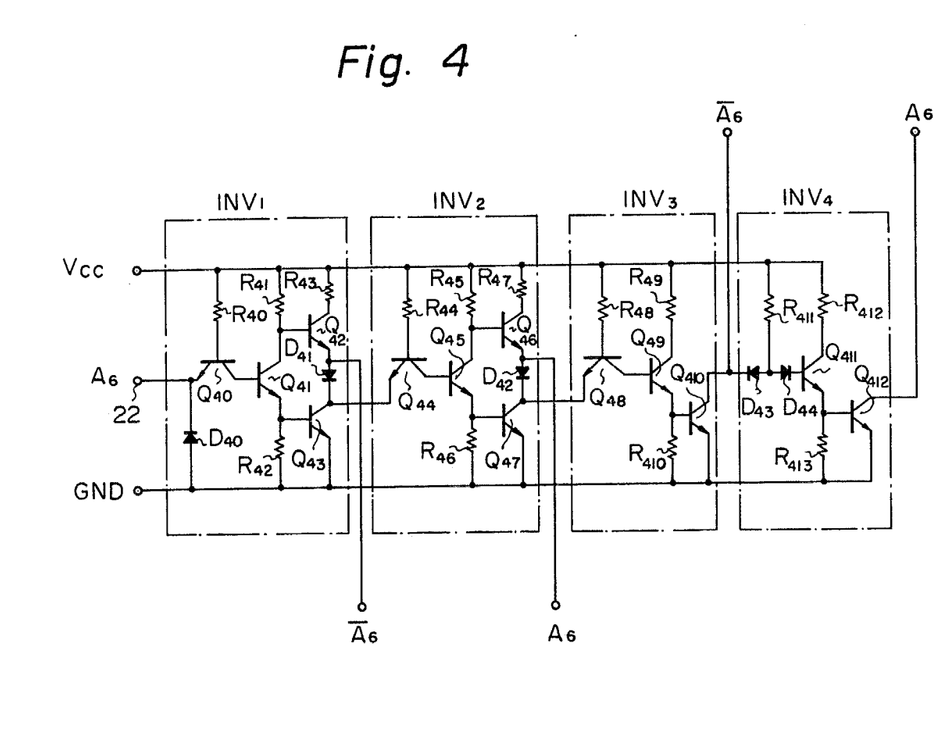
FIG. 4 is a circuit diagram of the bit address inverters used in the PROM device of FIG. 3.

FIG. 4 illustrates a detailed circuit of the bit address buffer $BB_6$, which is a series connection of four inverters $INV_1$ through $INV_4$. In FIG. 4, the input terminal 22 of the bit address buffer is connected to the emitter electrode of NPN type transistor $Q_{40}$, and is connected to the ground through the diode $D_{40}$. The base electrode of the transistor $Q_{40}$ is connected to a positive voltage source $V_{cc}$ through resistor $R_{40}$, and the collector electrode of the transistor $Q_{40}$ is connected to the base electrode of NPN type transistor $Q_{41}$. The collector electrode of the transistor $Q_{41}$ is connected to the base electrode of NPN type transistor $Q_{42}$, and to the voltage source $V_{cc}$ through resistor $R_{41}$. The emitter electrode of the transistor $Q_{41}$ is connected to the base electrode of NPN type transistor $Q_{43}$, and to the ground through resistor $R_{42}$. The collector electrode of the transistor $Q_{42}$ is connected to the voltage source through resistor $R_{43}$. The emitter electrode of the transistor $Q_{42}$ is connected to output terminal of the first inverter $INV_1$, and to the collector electrode of the transistor $Q_{43}$ through diode $D_{41}$. The collector electrode of the transistor $Q_{43}$ is connected to an input terminal of the second inverter $INV_2$, i.e. the emitter electrode of NPN type transistor $Q_{44}$. The structure of the second inverter circuit $INV_2$ is the same as that of the first inverter $INV_1$, except that the second inverter $INV_2$ does not contain a diode corresponding to the diode $D_{40}$ of the first inverter. The third inverter $INV_3$ consists of three NPN type transistors $Q_{48}$ through $Q_{410}$ and three resistors $R_{48}$ through $R_{410}$. The emitter electrode of the transistor $Q_{48}$ is connected to the collector electrode of transistor $Q_{47}$. The base electrode of the transistor $Q_{48}$ is connected to the voltage source $V_{cc}$ through the resistor $R_{48}$. The collector electrode of the transistor $Q_{48}$ is connected to the base electrode of the transistor $Q_{49}$. The collector electrode of the transistor $Q_{49}$ is connected to the voltage source $V_{cc}$ through the resistor $R_{49}$. The emitter electrode of the transistor $Q_{49}$ is connected to the base electrode of the transistor $Q_{410}$, and to the ground through the resistor $R_{410}$. The collector electrode of the transistor $Q_{410}$ constitutes an output terminal of the third inverter $INV_3$. The emitter electrode of the transistor $Q_{410}$ is connected to the ground. The fourth inverter $INV_4$ consists of two NPN type transistors $Q_{411}$ and $Q_{412}$, two diodes $D_{43}$, $D_{44}$, and three resistors $R_{411}$ through $R_{413}$. The cathode electrode of the diode $D_{43}$ constitutes an input terminal of the fourth inverter $INV_4$, and is connected to the collector electrode of the transistor $Q_{410}$. The anode electrodes of the diodes $D_{43}$ and $D_{44}$ are connected to each other, and to the voltage source $V_{cc}$ through resistor $R_{411}$. The cathode electrode of the diode $D_{44}$ is connected to the base electrode of the transistor $Q_{411}$. The collector electrode of $Q_{411}$ is connected to the voltage source $V_{cc}$ through the resistor $R_{412}$. The emitter electrode of the transistor $Q_{411}$ is connected to the base electrode of the transistor $Q_{412}$, and to the ground through the resistor $R_{413}$. The emitter electrode of the transistor $Q_{412}$ is connected to the ground, and the collector electrode of the transistor $Q_{412}$ constitutes an output terminal of the bit address buffer.

Operation of the circuit in FIG. 4 will now be described. Assume that a "low" voltage is applied to the input terminal 22, in which condition the transistor $Q_{40}$ turns on and the collector voltage of the transistor $Q_{40}$ becomes "low", thereby turning off the transistor $Q_{41}$. When the transistor $Q_{41}$ so turns off, no current flows from the collector to the emitter of the transistor $Q_{41}$. Therefore, no current flows through the resistor $R_{42}$, and the emitter voltage of the transistor $Q_{41}$ becomes "low" so that the transistor $Q_{43}$ turns off. In this condition, current flows from the voltage source $V_{cc}$ through the resistor $R_{41}$ to the base electrode of the transistor $Q_{42}$, and the transistor $Q_{42}$ turns on, so that the emitter electrode of the transistor $Q_{42}$ or the output terminal of the first inverter $INV_1$ becomes "high". If a "high" voltage is applied to the input terminal 22, no current flows from the voltage source $V_{cc}$ through the resistor $R_{40}$ to the emitter electrode of the transistor $Q_{40}$, so that the transistor $Q_{40}$ turns off, and current flows from the voltage source $V_{cc}$ through the resistor $R_{40}$ and the base-collector junction of the transistor $Q_{40}$ to the base electrode of the transistor $Q_{41}$. Consequently, the transistor $Q_{41}$ turns on, and current flows from the voltage source $V_{cc}$ through the resistor $R_{41}$, through the collector-emitter current path of $Q_{41}$ and through the resistor $R_{42}$ to the ground. Therefore, the voltage of the emitter electrode of the transistor $Q_{41}$ becomes higher than the forward biased voltage drop of the base-emitter junction of the transistor $Q_{43}$, and the transistor $Q_{43}$ turns on. When the transistor $Q_{43}$ so turns on, the collector voltage of the transistor $Q_{43}$ becomes "low" and current flows from the output terminal through the diode $D_{41}$ and the collector electrode of the transistor $Q_{43}$. In this condition, the emitter voltage of the transistor $Q_{42}$ is the sum of the forward voltage (about 0.8 volt) of the diode $D_{41}$ and the collector-emitter saturation voltage (about 0.2 volt), of transistor $Q_{43}$, and the base voltage of the transistor $Q_{42}$ is the sum of the collector-emitter saturation voltage (about 0.2 volt) of the transistor $Q_{41}$ and the forward voltage of the base-emitter junction of the transistor $Q_{43}$ (about 0.8 volt). Therefore, the base voltage and the emitter voltage of the transistor $Q_{42}$ are substantially the same, so that the transistor $Q_{42}$ turns off. The diode $D_{40}$ is used for absorbing the undershoot current through the input terminal 22 in order to protect the inverter circuit $INV_1$.

Operation of the second inverter $INV_2$ is the same as that of the first inverter $INV_1$, and the explanation thereof is omitted herein.

The third inverter $INV_3$ operates as follows. Assume that the emitter voltage of the transistor $Q_{48}$ is "low", in which condition the transistor $Q_{48}$ is turned on and the transistor $Q_{49}$ is turned off. Therefore, the emitter voltage of $Q_{49}$ is the same as that of the ground, and the transistor $Q_{410}$ is turned off so that the collector of the transistor $Q_{410}$, i.e. the output of the third inverter $INV_3$, becomes "high". If the emitter voltage of the transistor $Q_{48}$ is "high", the transistor $Q_{48}$ is turned off, and the base current of the transistor $Q_{49}$ flows from the voltage source $V_{cc}$ through the resistor $R_{48}$ and the base-collector junction of the transistor $Q_{48}$, so that the transistor $Q_{49}$ is turned on. In response to the turn-on of the transistor $Q_{49}$, the transistor $Q_{410}$ turns on and outputs the low level signal from its collector electrode.

The fourth inverter $INV_4$ operates as follows. Assume that a "low" level signal is applied to the cathode of the diode $D_{43}$, in which condition the current flows from the voltage source $V_{cc}$ through the resistor $R_{411}$ and the diode $D_{43}$. Therefore, the voltage of the common connection point of the anode electrode of the diodes $D_{43}$ and $D_{44}$ and one terminal of the resistor $R_{411}$ is pulled down to "low", so that the transistor $Q_{411}$ turns off. Consequently, the transistor $Q_{412}$ turns off and outputs a "high" level signal from the collector thereof. If a "high" level signal is applied to the cathode of the diode $D_{43}$, current flows from the voltage source $V_{cc}$ through the resistor $R_{411}$ and the diode $D_{44}$ to the base electrode of the transistor $Q_{411}$, so that the transistor $Q_{411}$ turns on. Therefore, current flows from the voltage source $V_{cc}$ through the resistor $R_{412}$, the collector-emitter junction of the transistor $Q_{411}$, and the resistor $R_{413}$ to the ground, and the emitter voltage of the transistor $Q_{411}$ becomes high. Consequently, the transistor $Q_{412}$ turns on and outputs a low level signal from the collector electrode thereof.

It should be noted that the third inverter $INV_3$ and the fourth inverter $INV_4$ do not contain output transistors corresponding to the transistor $Q_{42}$ of the first inverter $INV_1$, and the input circuit of the fourth inverter $INV_4$ is composed of the diodes $D_{43}$ and $D_{44}$ and the resistor $R_{411}$. This is because it is necessary to protect the inverters $INV_3$ and $INV_4$ from breaking down when the high voltage writing-in signal is applied to the output terminals of the inverters $INV_3$ and $INV_4$ from the program circuit 20.

Figure 5:
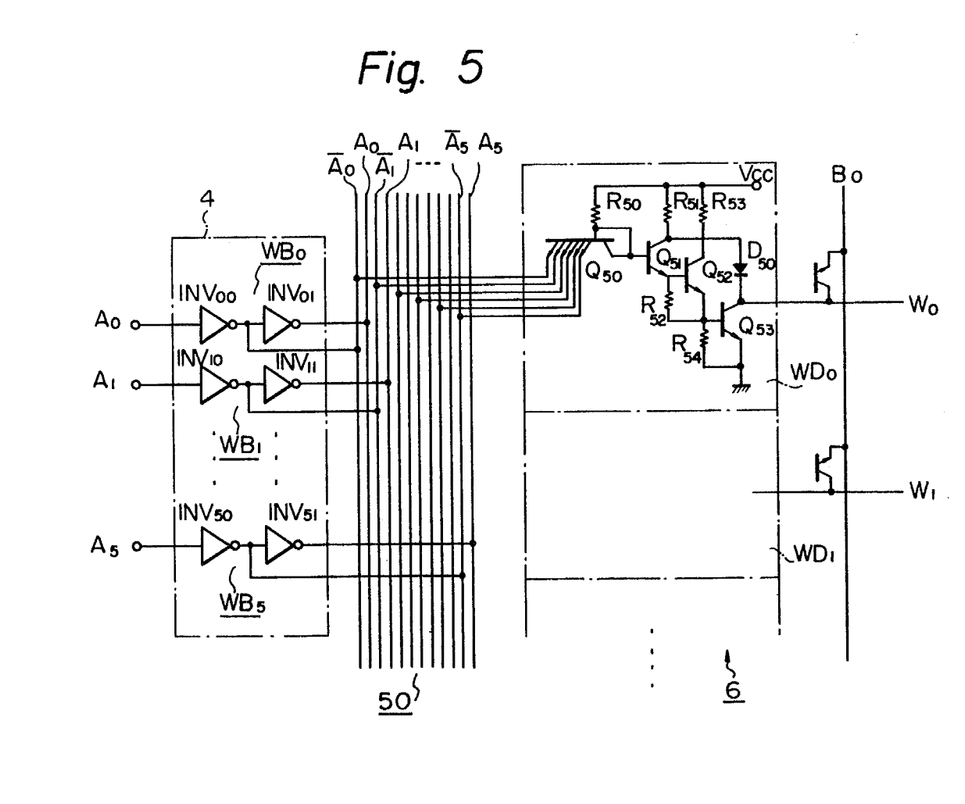
FIG. 5 is a circuit diagram of a word address decoder/driver circuit used in the PROM device of FIG. 3.

FIG. 5 is a circuit diagram illustrating the word address decoder/driver circuit used in the embodiment of the PROM described above. In FIG. 5, the word address buffer 4 consists of six word address buffer units $WB_0$ through $WB_5$, each of which consists of two inverters in series, $INV_{00}$ and $INV_{01}$ through $INV_{50}$ and $INV_{51}$ respectively. Output terminals of the inverters $INV_{00}$, $INV_{01}$ through $INV_{50}$, $INV_{51}$ are connected to the corresponding two leads of word address signal lines 50. The word address decoder/driver circuit 6 consists of 64 word address decoder/driver units $WD_0$ through $WD_{63}$, whose output terminals are connected to the corresponding word lines $W_0$ through $W_{63}$ of the memory cell array. Each decoder/driver unit, for example $WD_0$, comprise a multi-emitter transistor $Q_{50}$, three NPN type transistors $Q_{51}$, $Q_{52}$, and $Q_{53}$, a diode $D_{50}$ connected between collectors of the transistors $Q_{51}$ and $Q_{53}$, and five resistors $R_{50}$ through $R_{54}$. Emitters of the multi-emitter transistor $Q_{50}$ are selectively connected to the leads of the word address signal lines 50. For example, in the word address decoder/driver unit $WD_0$ whose output is connected to the word line $W_0$, the emitters of the transistor $Q_{50}$ are connected to the leads $\bar{A}_0$, $\bar{A}_1$, $\bar{A}_2$, $\bar{A}_3$, $\bar{A}_4$, and $\bar{A}_5$, respectively.

Operation of a decoder/driver unit, for example $WD_0$, will now be described. Assume that the input word address signals $A_0$ through $A_5$ are all "low", in which condition the voltage levels of the address signal leads $\bar{A}_0$, $\bar{A}_1$, $\bar{A}_2$, $\bar{A}_3$, $\bar{A}_4$, and $\bar{A}_5$ are all "high", and the multi-emitter transistor $Q_{50}$ turns off. Therefore, current flows from the positive voltage source $V_{cc}$ through the resistor $R_{50}$ to the base of the transistor $Q_{51}$, so that the transistor $Q_{51}$ turns on. In response to the turning on of the transistor $Q_{51}$, the transistors $Q_{52}$ and $Q_{53}$ turn on, and the word line $W_0$ is pulled down to a "low" voltage level, which means the selection of the word line $W_0$.

The diode $D_{50}$ is used to decrease the base current of the transistors $Q_{51}$ through $Q_{53}$ and sustain the transistor $Q_{51}$ in an unsaturated condition in the reading-out mode, in order to gain a high operating speed. The diode $D_{50}$ is cut off in the writing-in mode, because the writing-in current at high voltage is supplied from the writing-in circuit through the selected bit line and the selected memory cell to the word line $W_0$. In the reading-out mode, the diode $D_{50}$ turns on and the collection current of the transistor $Q_{51}$ flows separately through the emitter of $Q_{51}$ and the collector of the transistor $Q_{53}$. Therefore, the base current of the transistor $Q_{52}$ decreases and the base current of the transistor $Q_{53}$ also decreases, so that high switching speed of the transistor $Q_{53}$ is attained.

When at least one of the address signal leads $\bar{A}_0$, $\bar{A}_1$, $\bar{A}_2$, $\bar{A}_3$, $\bar{A}_4$, or $\bar{A}_5$ is "low", the multi-emitter transistor $Q_{50}$ turns on and the collector voltage of the transistor $Q_{50}$ becomes low, so that the transistor $Q_{51}$, and therefore the transistors $Q_{52}$ and $Q_{53}$, all turn off. Therefore, the voltage of the collector of the transistor $Q_{53}$ connected to the word line $W_0$ goes "high", which means that the word line $W_0$ is not selected.

Figure 6:
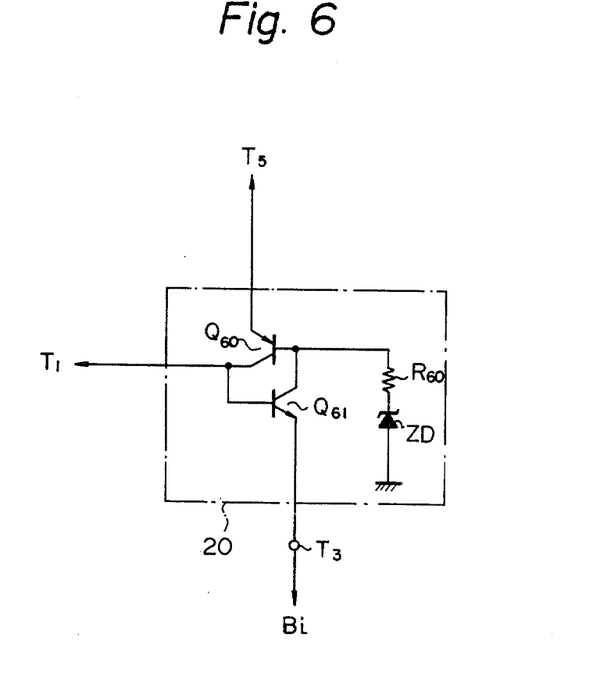
FIG. 6 is a circuit diagram of a program circuit unit as used in the PROM device of FIG. 3.

FIG. 6 illustrates the writing-in circuit unit or the program circuit unit for one bit line as used in the PROM embodiment described above. In the 4 K PROM device, 64 writing-in circuit units are used. The writing-in circuit unit in FIG. 6 comprises a PNP type transistor $Q_{60}$, an NPN type transistor $Q_{61}$, and a series connected resistor $R_{60}$ and zener diode ZD. The collector electrode of the transistor $Q_{60}$ is connected to the output terminal $T_1$ of the bit address decoder $G'_1$ of FIG. 3 and to the base electrode of the transistor $Q_{61}$. The emitter electrode of the transistor $Q_{60}$ is connected to the output terminal $T_5$ of the output buffer 16 of FIG. 3. The base electrode of the transistor $Q_{60}$ is connected to collector electrode of the transistor $Q_{61}$ and to the series connected resistor $R_{60}$ and zener diode ZD, which has, for example, a zener voltage of about 20. The emitter electrode of the transistor $Q_{61}$ is connected to the terminal $T_3$ connected to a bit line $B_i$.

Operation of the circuit of FIG. 6 will now be described. Assume that a high voltage writing-in current of a constant current, for example 25 V–120 mA, is supplied through the output terminal $T_5$ to the emitter electrode of the transistor $Q_{60}$. A base current flows from the base electrode of the transistor $Q_{60}$ to the series connected resistor $R_{60}$ and zener diode ZD, and the PNP type transistor $Q_{60}$ turns on. In this state, if the voltage level of the output terminal $T_1$ of the decoder $G'_1$ is "high" (selected condition), current flows from the collector electrode of the transistor $Q_{60}$ to the base electrode of the transistor $Q_{61}$, so that the transistor $Q_{61}$ turns on.

When transistors $Q_{60}$ and $Q_{61}$ so turn on, the writing-in current passes from the output terminal $T_5$ through the transistors $Q_{60}$ and $Q_{61}$ and the terminal $T_3$ to the selected bit line $B_i$.

In the circuit of FIG. 6, the series connection of the resistor $R_{60}$ and the zener diode ZD constitutes a voltage control circuit which causes transistor $Q_{60}$ to turn off in the reading out mode, so that no current flows from the output terminal $T_5$ through the writing-in circuit.

Figure 7:
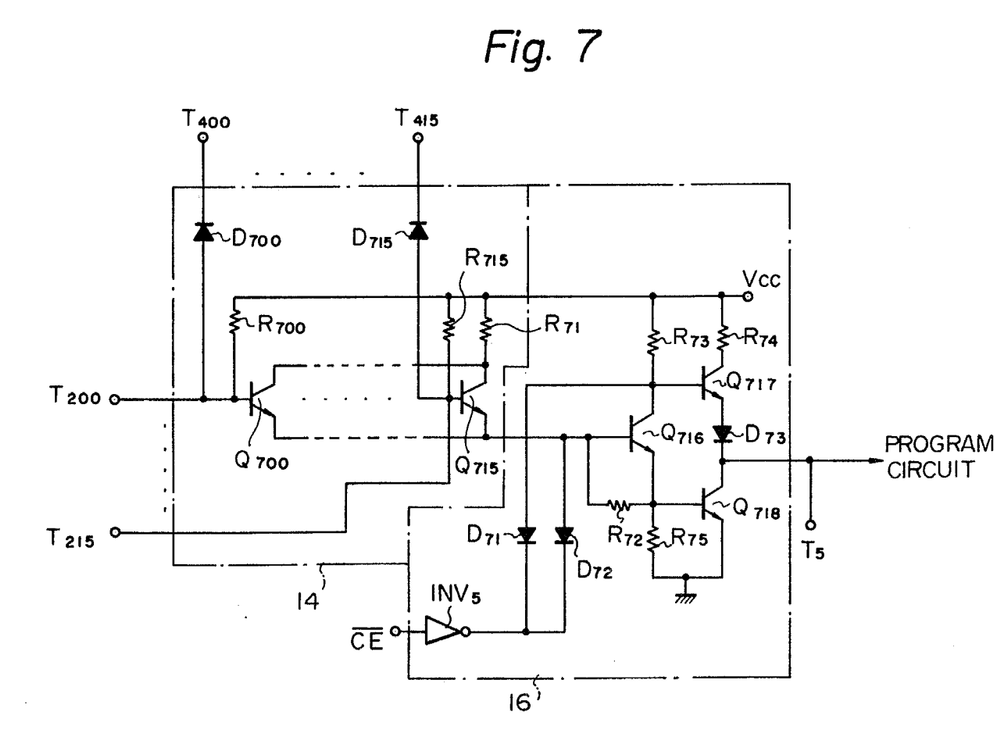
FIG. 7 is a circuit diagram illustrating a multiplexer unit and an output buffer unit used in the PROM device of FIG. 3.

FIG. 7 illustrates the multiplexer unit and the output buffer unit used in the preferred embodiment of the PROM device described above. In FIG. 7, input terminals $T_{200}$ through $T_{215}$ of the multiplexer unit or the reading-out circuit unit are connected respectively to the base electrodes of 16 NPN transistors $Q_{700}$ through $Q_{715}$, the collector electrodes of which are connected commonly to the voltage source $V_{cc}$ through resistor $R_{71}$, and the emitter electrodes of which are connected commonly to the base electrode of NPN transistor $Q_{716}$. Each base electrode of the transistors $Q_{700}$ through $Q_{715}$ is connected to the anode electrode of one of the diodes $D_{700}$ through $D_{715}$, and each cathode electrode of the diodes $D_{700}$ through $D_{715}$ is connected to one of the bit line terminals $T_{400}$ through $T_{415}$, respectively, which are connected to the bit lines of the memory cell array. Each base electrode of the transistors $Q_{700}$ through $Q_{715}$ is connected to the voltage source $V_{cc}$ through one of resistors $R_{700}$ through $R_{715}$, respectively. The collector electrode of the transistor $Q_{716}$ is connected to the base electrode of NPN transistor $Q_{717}$, and to the voltage source $V_{cc}$ through resistor $R_{73}$. The emitter electrode of the transistor $Q_{716}$ is connected to the base electrode of NPN transistor $Q_{718}$, and to the ground through resistor $R_{75}$. The base electrode and the emitter electrode of the transistor $Q_{716}$ are connected to each other through resistor $R_{72}$. The collector electrode of the transistor $Q_{717}$ is connected to the voltage source $V_{cc}$ through resistor $R_{74}$. The collector electrode of the transistor $Q_{718}$ is connected to the output terminal $T_5$, and to the emitter electrode of the transistor $Q_{717}$ through diode $D_{73}$. The emitter electrode of the transistor $Q_{718}$ is connected to the ground. The output terminal $T_5$ is also connected to the current input terminal of the writing-in circuit 20 of FIG. 3. The base electrodes of the transistors $Q_{716}$ and $Q_{717}$ are connected to a common output terminal of inverter $INV_5$ through diodes $D_{71}$ and $D_{72}$ respectively. In the 4 K-bit PROM device, four multiplexer units and four output buffer units are used, and one quarter of them is shown in FIG. 7.

Operation of the circuit of FIG. 7 will now be described. Assume that the level of the input terminal $T_{200}$ which is connected to the output terminal of the bit address decoder is "high", and the level of the bit line terminal $T_{400}$ is "high", which means that the memory cell transistor $Q_c$ connected between the selected word line and the bit line, which is connected to the terminal $T_{400}$, is not short-circuited. In this condition, the base electrode of the transistor $Q_{700}$ becomes "high", the transistor $Q_{700}$ turns on, and the transistor $Q_{716}$ turns on. In response to the turn-on of the transistor $Q_{716}$, the transistor $Q_{718}$ turns on and the transistor $Q_{717}$ turns off; thereby the level of the output terminal $T_5$ becomes "low".

If the selected memory cell $Q_c$ is short-circuited at its emitter-base junction, the level of the base electrode of the transistor $Q_{700}$ is "low", and the transistor $Q_{700}$ turns off. In this case, the other transistors $Q_{701}$ through $Q_{715}$, which are connected parallel to the transistor $Q_{700}$, are also turned off because the other input terminals $T_{201}$ through $T_{215}$ have been pulled down to a "low" level by non-selected bit address decoders. Therefore, the transistor $Q_{716}$ turns off, the transistor $Q_{718}$ turns off, and the transistor $Q_{717}$ turns on, so that the level of the output terminal $T_5$ goes "high".

In the above, the operation of the reading-out circuit in the reading-out mode was described. In the writing-in mode, the chip enable signal $\overline{CE}$ is caused to become "high", and the output level of the inverter $INV_5$ goes "low"; thereby, the transistors $Q_{716}$, $Q_{717}$, and $Q_{718}$ are all turned off. In such a state, the writing-in current of a high voltage is supplied to the output terminal $T_5$ and the writing-in operation is effected as described with reference to FIG. 6. However, the transistors $Q_{717}$ and $Q_{718}$ do not suffer breakdown because these transistors are in a cut-off state.

Figure 8:
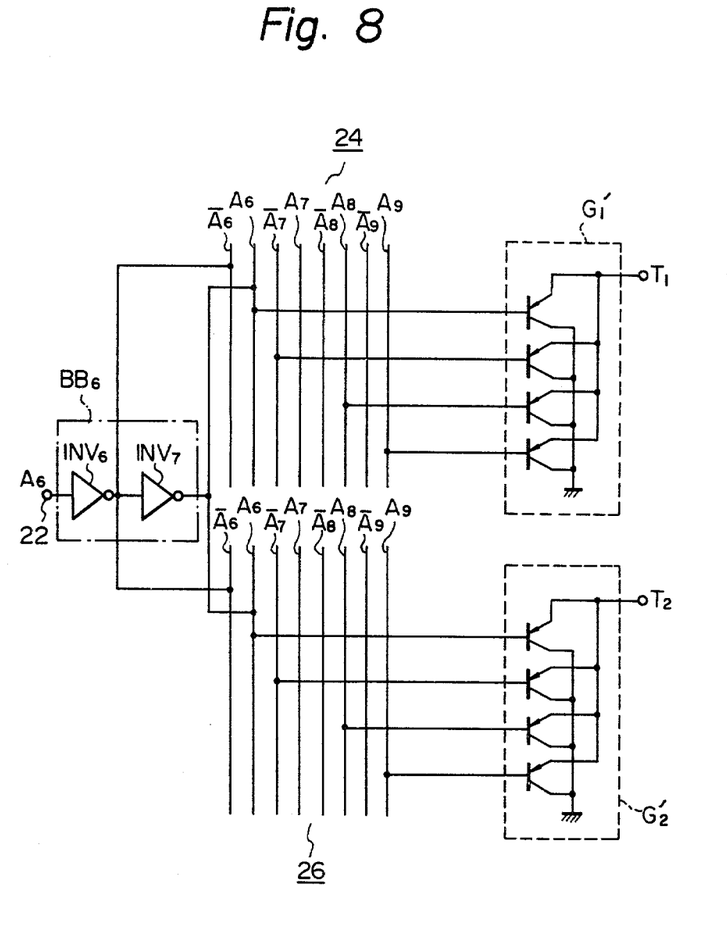
FIG. 8 is a partial block diagram of a part of a PROM device in another embodiment of the present invention, with simplified bit address buffers.

FIG. 8 illustrates another embodiment of the present invention. In FIG. 8, the bit address buffer unit $BB'_6$ is composed of two inverters $INV_6$ and $INV_7$ connected in series, the output terminals of which are connected to the address signal lines 24 of the writing-in stage and the address signal lines 26 of the reading-out stage. The other circuits are the same as the circuits explained with reference to FIG. 3. In the prior art PROM device illustrated in FIG. 2, the address signals to the writing-in stage and the address signals to the reading-out stage are supplied from different inverters, in order not to decrease the operating speed of the reading-out stage. However, in this embodiment of the present invention, it is possible to omit two inverters and to supply the bit address signals to the writing-in stage and the reading-out stage from common inverters, as shown in FIG. 8, so that the bit address buffer circuits can be greatly simplified and the packing density of the PROM device can be increased. This is because the current, that flows from the program circuit 20 through the bit address decoder 12 to the bit address inverters can be very small according to the present invention.

In the above description, a PROM device having shorted-junction type memory cells is explained. However, it should be noted that the present invention can be adapted to other types of PROM devices, for example, to a bipolar PROM device having fuse-blown type memory cells.

It is preferable to adapt the present invention to a PROM device, including Schottky TTL gates, which can be formed without gold doping of the substrate of the device. In such a PROM device, the PNP type transistors of the bit address decoders can be formed as so-called "vertical PNP type transistors".

What is claimed is:

1. A bipolar PROM device having a plurality of memory cells which are located at respective cross positions of a plurality of word lines and a plurality of bit lines and which are selected by word address signals and bit address signals applied to said PROM device, said PROM device comprising:
   a word address buffer for amplifying said word address signals;
   a word address decoder for decoding the word address signals from said word address buffer;
   one or more bit address buffers for amplifying said bit address signals;
   a first bit address decoder for decoding the bit address signals from said bit address buffer for writing-in of information;
   a second bit address decoder for decoding the bit address signals from said one or more bit address buffers for reading-out of information, at least one of said first and second bit address decoders being composed of a plurality of AND gates, each of said AND gates comprising an output terminal and a plurality of PNP type transistors each comprising an emitter, a base, and a collector, to each said base of said transistors being applied the address signals from said bit address buffer, each said collector of said transistors being connected commonly to ground, and each said emitter of said transistor being connected commonly to said output terminal of said AND gate;
   a program circuit for initially writing-in information to the selected memory cells; and
   a multiplexer for reading-out information from the selected memory cells.

2. A bipolar PROM device as set forth in claim 1, wherein said bit address signals are supplied to said first and second bit address decoders from a single common bit address buffer.

3. A bipolar PROM device as set forth in claim 2, wherein said common bit address buffer is composed of a plurality of pairs of series connected inverters.

4. A bipolar PROM device as set forth in claim 1, wherein said bit address signals are supplied to said first and second bit address decoders through address signal lines.

5. A bipolar PROM device as set forth in claim 1, wherein said first bit address decoder comprises output terminals which are connected to input terminals of said program circuit.

6. A bipolar PROM device as set forth in claim 1, wherein said second bit address decoder comprises output terminals which are connected to input terminals of said multiplexer.

7. A bipolar PROM device as set forth in claim 1, wherein each of said plurality of memory cells consists of an open base type transistor connected between one of said plurality of bit lines and one of said plurality of word lines 8. A bipolar PROM device as set forth in claim 1, wherein said PNP transistors comprise vertical transistors.

9. A bipolar PROM device as set forth in claim 1, wherein said bit address signals are supplied to said first and second bit address decoders and wherein each of said bit address buffers comprises first, second, third, and fourth inverters connected in series, said first and second inverters of each respective bit address buffer being connected to said second bit address decoder, and said third and fourth inverters being connected to said first bit address decoder.

* * * * *

UNITED STATES PATENT AND TRADEMARK OFFICE
CERTIFICATE OF CORRECTION

PATENT NO. : 4,347,584

DATED : Aug. 31, 1982

INVENTOR(S) : Fukushima et al.

It is certified that error appears in the above-identified patent and that said Letters Patent is hereby corrected as shown below:

Front page, [57] Abstract, line 1, delete "the improved".
Column 1, line 17, "of the" should be --of a--;
Column 1, line 18, "by a" should be --by the--;
Column 1, line 32, after "used" insert --,--.
Column 4, line 35, after "$A_8$," insert --and--.
Column 6, line 49, "$D_{43}$, $D_{44}$" should be --$D_{43}$ and $D_{44}$, --.
Column 7, line 22, after "$Q_{41}$" insert --,--;
Column 7, line 34, delete "," (first occurrence).
Column 11, line 15, delete ",".

Signed and Sealed this

Fifth Day of April 1983

[SEAL]

Attest:

Attesting Officer

GERALD J. MOSSINGHOFF

Commissioner of Patents and Trademarks